United States Patent
Kitaura et al.

(10) Patent No.: US 7,992,313 B2
(45) Date of Patent: Aug. 9, 2011

(54) SENSOR CHIP, DETECTION DEVICE AND METHOD OF MANUFACTURING DETECTION DEVICE

(75) Inventors: Naoki Kitaura, Niigata-ken (JP); Toshiaki Konno, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/539,225

(22) Filed: Aug. 11, 2009

(65) Prior Publication Data

US 2009/0293294 A1 Dec. 3, 2009

(30) Foreign Application Priority Data

Feb. 14, 2007 (JP) .................................. 2007-033273
Feb. 13, 2008 (WO) ................... PCT/JP2008/052290

(51) Int. Cl.
*G01C 17/28* (2006.01)

(52) U.S. Cl. ..................................... 33/355 R

(58) Field of Classification Search .................... 33/316, 33/319, 324, 355 R, 356
See application file for complete search history.

(56) References Cited

U.S. PATENT DOCUMENTS

| | | | | |
|---|---|---|---|---|
| 5,456,018 | A * | 10/1995 | Irlbeck et al. | 33/645 |
| 7,194,815 | B2 * | 3/2007 | Miyashita et al. | 33/355 R |
| 7,346,466 | B2 * | 3/2008 | Sato | 33/356 |
| 2005/0122100 | A1 | 6/2005 | Wan et al. | |
| 2006/0021238 | A1 * | 2/2006 | Sato et al. | 33/356 |
| 2006/0185182 | A1 * | 8/2006 | Sato | 33/356 |
| 2009/0093981 | A1 * | 4/2009 | Withanawasam | 33/356 |
| 2010/0251557 | A1 * | 10/2010 | Albo et al. | 33/318 |

FOREIGN PATENT DOCUMENTS

| | | |
|---|---|---|
| JP | 02-111085 | 4/1990 |
| JP | 2003-066127 | 3/2003 |
| JP | 2005-123478 | 5/2005 |
| JP | 2005-233630 | 9/2005 |
| JP | 2005-274302 | 10/2005 |
| JP | 2006-234615 | 9/2006 |

OTHER PUBLICATIONS

Office Action issued in corresponding Japanese Patent Application No. 2008-558088; issued Jan. 5, 2010.

* cited by examiner

*Primary Examiner* — G. Bradley Bennett

(74) *Attorney, Agent, or Firm* — Brinks Hofer Gilson & Lione

(57) ABSTRACT

A detection device includes an X-axis magnetic sensor, a Y-axis magnetic sensor, and a Z-axis magnetic sensor each having a sensing axis for detecting a geomagnetic azimuth and a sensor controlling semiconductor. The magnetic sensors are selected from those fabricated from the same wafer, each having the same structure, and directly mounted on the circuit substrate by directing the respective sensing axes of the magnetic sensors at different predetermined angles. Electrodes of the magnetic sensors for conducting the sensor controlling semiconductor are located in a parallel row at one side of the sensing surface.

11 Claims, 4 Drawing Sheets

SENSOR CHIP, DETECTION DEVICE AND METHOD OF MANUFACTURING DETECTION DEVICE

CLAIM OF PRIORITY

This application claims benefit of the Japanese Patent Application No. 2007-033273 filed on Feb. 14, 2007, which is hereby incorporated by reference.

BACKGROUND OF THE INVENTION

1. Field of the Invention

The present invention relates to a sensor chip with at least one sensing axis, a detection device provided with the sensor chip, and a method of manufacturing the detection device.

2. Description of the Related Art

Besides the GPS (Global Posting System), the use of such detection device as the magnetic direction detector for providing the azimuth information with excellent sensitivity for the terminal device such as the mobile phone and the on-board car navigation device has been the recent trend.

A generally employed magnetic direction detector is provided with an X-axis magnetic sensor for detecting an X-axis geomagnetism, a Y-axis magnetic sensor for detecting a Y-axis geomagnetism, and a Z-axis magnetic sensor for detecting a Z-axis geomagnetism so as to allow detection of each geomagnetism at three axes, that is, X, Y and Z axes.

The magnetic direction detector has three magnetic sensors and a sensor controlling semiconductor mounted on a surface of a circuit substrate. The respective magnetic sensors and the sensor controlling semiconductor are integrated by sealing with a sealing member formed of such material as an insulating resin (see Japanese Unexamined Patent Application Publication No. 2005-233630).

Each magnetic sensor includes a sensing axis for detecting the geomagnetism. Among those magnetic sensors, the X-axis magnetic sensor is mounted on a main circuit substrate by directing the sensing axis at the angle to detect the geomagnetism in any one of a front-to-rear direction and a left-to-right direction of the magnetic direction detector. The Y-axis magnetic sensor is mounted on the main circuit substrate by directing the sensing axis at the angle to detect the geomagnetism in the other of the front-to-rear direction and the left-to-right direction. The Z-axis magnetic sensor is mounted on a sub-circuit substrate. The sub-circuit substrate with the Z-axis magnetic sensor is designed to stand on the main circuit substrate. The Z-axis magnetic sensor is mounted on the main circuit substrate by directing the sensing axis at the angle to detect the geomagnetism in an up-and-down direction of the magnetic direction detector via the sub-circuit substrate.

Electrodes for conductively connecting the respective magnetic sensors to the sensor controlling semiconductor are formed at each circumferential edge of one surface of the magnetic sensor with a rectangular box shape, and at each circumferential edge of one surface of the sensor controlling semiconductors. Each of the respective electrodes is conductively connected to the electrode of the sensor controlling semiconductor via the lead wire, respectively.

Those X-axis, Y-axis and Z-axis magnetic sensors are manufactured from different wafers exclusively for the respective sensors. That is, each of the resultant magnetic sensors mounted on the magnetic direction detector is fabricated from the different wafer.

The generally employed magnetic direction detector provided with the respective magnetic sensors each formed of the different wafer may vary the magnetic property among the magnetic sensors. Upon detection of the geomagnetism by the aforementioned magnetic direction detector, an error in the detection sensitivity with respect to the geomagnetism detected by the respective magnetic sensors may be observed. As a result, the aforementioned magnetic direction detector may have a risk of failing to detect the accurate geomagnetism.

In the generally employed magnetic direction detector, the Z-axis magnetic sensor is mounted on the main circuit substrate via the sub-circuit substrate. So there may be an error in the detection sensitivity with respect to the geomagnetism between the Z-axis magnetic sensor and the other magnetic sensors. Accordingly, the aforementioned magnetic direction detector may fail to accurately detect the geomagnetism. As the sub-circuit substrate stands on the main circuit substrate, the thickness of the magnetic direction detector may be increased depending on the size of the sub-circuit substrate. The resultant structure fails to satisfy the down-sizing requirement of the magnetic direction detector.

SUMMARY OF THE INVENTION

The present invention provides a sensor chip which accurately detects an azimuth to form the highly reliable detection device, a detection device capable of improving the reliability by detecting the accurate azimuth while reducing the size, and a method of manufacturing the detection device.

The sensor chip according to the present invention is mounted on a circuit substrate of a detection device, and has at least one sensing axis. The sensor chip is mounted by directing one surface opposite the circuit substrate to form a horizontal mount surface directly mountable on the circuit substrate such that the sensing axis is horizontally located with respect to a surface of the circuit substrate. The other surface of the sensor chip is mounted opposite the circuit substrate to form a cross mount surface directly mountable on the circuit substrate such that the sensing axis is located at an angle to cross the surface of the circuit substrate.

The sensor chip according to the present invention may be directly mounted on the circuit substrate while allowing the sensing axis to be horizontally disposed on a surface of the circuit substrate, and the sensing axis to be at an angle crossing the surface of the circuit substrate. The detection device for detecting three-axis-direction of X, Y, and Z axes may use the sensor chips each fabricated from the same wafer. The respective sensor chips may be mounted directly on the circuit substrate without using the sub-circuit substrate.

In the sensor chip, a same electrode formed on the sensor chip is allowed to be used for conducting between the sensor chip and the circuit substrate in both cases where the electrode is mounted on the horizontal mount surface and on the crossing mount surface.

Another sensor chip according to the present invention does not require different electrodes to be mounted on the horizontal mount surface and the cross mount surface. This makes it possible to reduce the manufacturing cost of the sensor chip and to simplify the manufacturing step.

The electrodes of the sensor chip are arranged in a row.

In the sensor chip according to the present invention, the electrodes are arranged in a parallel row to simplify the leading operation of the lead-wire for conductively connecting the respective electrodes to the electrodes of the sensor controlling semiconductor. The present invention improves the workability for leading the respective lead wires, and prevents the short-circuit caused by abutment of the lead wires with one another. The lead wires may be led without being entangled with one another, thus reducing the size of the detection device using the sensor chip.

The sensor chip has substantially a rectangular box shape. The electrodes are provided on a side at which one of the horizontal mount surface and the crossing mount surface is in contact with a surface opposite the other of the horizontal mount surface and the crossing mount surface.

When the sensor chip according to the present invention is mounted on any one of the horizontal mount surface and the cross mount surface, the electrode on the sensor chip is located at the position close to the circuit substrate. The connection to the electrode on the circuit substrate may be easily performed. When the sensor chip is mounted on the other surface, the electrode is mounted horizontally with respect to the circuit substrate, thus allowing easy connection through the wire bonding.

A detection device according to the present invention includes a plurality of sensor chips each having at least one sensing axis directly mounted on a circuit substrate. The sensor chip includes a horizontally positioned sensor having the sensing axis horizontally located with respect to one surface of the circuit substrate, and a cross positioned sensor having the sensing axis located at an angle crossing the circuit substrate. The horizontally positioned sensor has the same structure as that of the cross positioned sensor.

In the detection device, each of the horizontally positioned sensor and the cross positioned sensor has the same structure, which allows the use of the same wafer for forming the respective sensor chips. As a result, each of the horizontally positioned sensor and the cross positioned sensor may have a uniform property. Both the horizontally positioned sensor and the cross positioned sensor may be directly mounted on the circuit substrate without using the sub-circuit substrate.

In the detection device, the horizontally positioned sensor and the cross positioned sensor are conducted to the circuit substrate using the same electrodes of the respective sensors at the same locations.

In another detection device according to the present invention, electrodes for the horizontally positioned sensor and the cross positioned sensor do not have to be formed at the different positions, thus reducing the cost for manufacturing the sensor chips and simplifying the manufacturing step.

In the detection device, the same electrodes are formed on the sensor chip in a row.

In the detection device according to the present invention, the electrodes of the respective sensor chips are arranged in a parallel row, thus simplifying the leading operation of the lead wires for conductively connecting the respective electrodes and the electrodes of the sensor controlling semiconductor. This makes it possible to improve the leading workability of the respective lead wires, and to prevent the short-circuit caused by abutment among the lead wires. Further, the leading operation may be performed without entangling the lead wires, thus reducing the size of the detection device.

In the detection device, at least one of the sensor chips is mounted such that one side where the electrodes provided in a row on an electrode-forming surface on which the electrodes are formed is positioned at a side of the circuit substrate. A wiring is formed on the circuit substrate for connecting the electrodes of the sensor chip and the circuit substrate.

In the detection device, the wiring is formed on the circuit substrate for connecting the respective electrodes of the sensor chip and the corresponding electrodes of the sensor controlling semiconductor. The leading operation of the lead wire for conductively connecting the respective electrodes of the sensor chip to the electrodes of the sensor controlling semiconductor may be simplified, thus improving the leading workability of the lead wires. The short-circuit caused by the abutment among the respective lead wires may be prevented to allow the leading operation without entangling the lead wires. This makes it possible to reduce the thickness and size of the detection device.

In the detection device, a ball-shaped corner bump is used for conductively connecting the electrodes of the sensor chip and the wiring.

In the detection device, the respective electrodes of the sensor chip are conductively connected to the respective wirings with ball-like corner bumps to cope with the electrodes arranged at narrow pitches.

In the detection device, the sensor chip includes at least an X-axis magnetic sensor which allows the sensing axis to detect a geomagnetic azimuth in an X-axis direction, a Y-axis magnetic sensor which allows the sensing axis to detect a geomagnetism in a Y-axis direction, and a Z-axis magnetic sensor which allows the sensing axis to detect a geomagnetism in a Z-axis direction.

The detection device includes three magnetic sensors, that is, the X-axis magnetic sensor, Y-axis magnetic sensor and Z-axis magnetic sensor, and is capable of detecting three-axis geomagnetism at X, Y, and Z axes.

A method of manufacturing a detection device which mounts a plurality of sensor chips each with at least one sensing axis on a circuit substrate according to the present invention includes the steps of selecting the sensor chip from sensor chips which are fabricated from a same wafer to have same structures, and mounting the sensor chips having the sensing axes directed at different predetermined angles.

In the method, the sensor chips are selected from those fabricated from the same wafer, each having the same structure. The detection device may be formed of the sensor chips each with the uniform property. The respective sensor chips may be directly mounted on the circuit substrate without using the sub-circuit substrate.

In the method, each of the respective sensing axes includes at least an axis which is horizontal with respect to the circuit substrate, and an axis which crosses the circuit substrate.

In the method of manufacturing the detection device, the sensor chips having the sensing axis directed in a horizontal or a crossing direction with respect to the circuit substrate may be selected from those fabricated from the same wafer, each having the same structure. This makes it possible to manufacture the detection device using the sensor chips each having the uniform property.

The method further includes an inspection step for inspecting each property of the sensor chips to select and mount the sensor chips from those fabricated from the same wafer, each having the same property.

In the method, the sensor chips may be selected from those fabricated from the same wafer, each having the uniform property. This makes it possible to manufacture the detection device which provides highly reliable detection results.

The sensor chips according to the present invention fabricated from the same wafer may be used for manufacturing the detection device equipped with the plural sensor chips. Each sensor chip has the uniform property, making it possible to manufacture the detection device capable of providing the highly reliable detection results. The sensor chips may be directly mounted on the circuit substrate without using the sub-circuit substrate, thus reducing the size of the detection device using the sensor chips.

The detection device according to the present invention uses the sensor chips each having the uniform property for detection so as to prevent error in the detection results from the respective sensor chips. This ensures to improve reliability of the detection device, and to easily enhance the performance to be higher. The sensor chips may be directly mounted on the circuit substrate without using the sub-circuit substrate, thus reducing the number of parts. The manufacturing step for mounting the sub-circuit substrate on which the sensor chips are formed may be eliminated, thus reducing the cost. Displacement of the sensing axis may be prevented while reducing the size of the detection device by mounting the sensor chips directly on the circuit substrate, resulting in the highly reliable detection device.

The method of manufacturing the detection device according to the present invention allows the use of sensor chips each with the uniform property to manufacture the detection device for providing the highly reliable detection results. The sensor chips may be directly mounted on the circuit substrate without using the sub-circuit substrate, thus reducing each size of the sensor chips, and preventing displacement of the sensing axis. As a result, the reliability of the detection device may further be enhanced.

DESCRIPTION OF THE PREFERRED EMBODIMENTS

An example of a detection device using the sensor chip according to the present invention will be described referring to FIGS. 1 to 6. In the example, a magnetic sensor for detecting a geomagnetism is used as the sensor chip, and a magnetic direction detector equipped with the magnetic sensor is used as the detection device. However, the present invention is not limited to the aforementioned structure but applicable to an accelerator sensor for detecting the acceleration with respect to three axes, that is, X, Y and Z axes, and various types of the sensor chip such as an angular speed sensor for detecting the gradient and direction per second.

Figure 1:
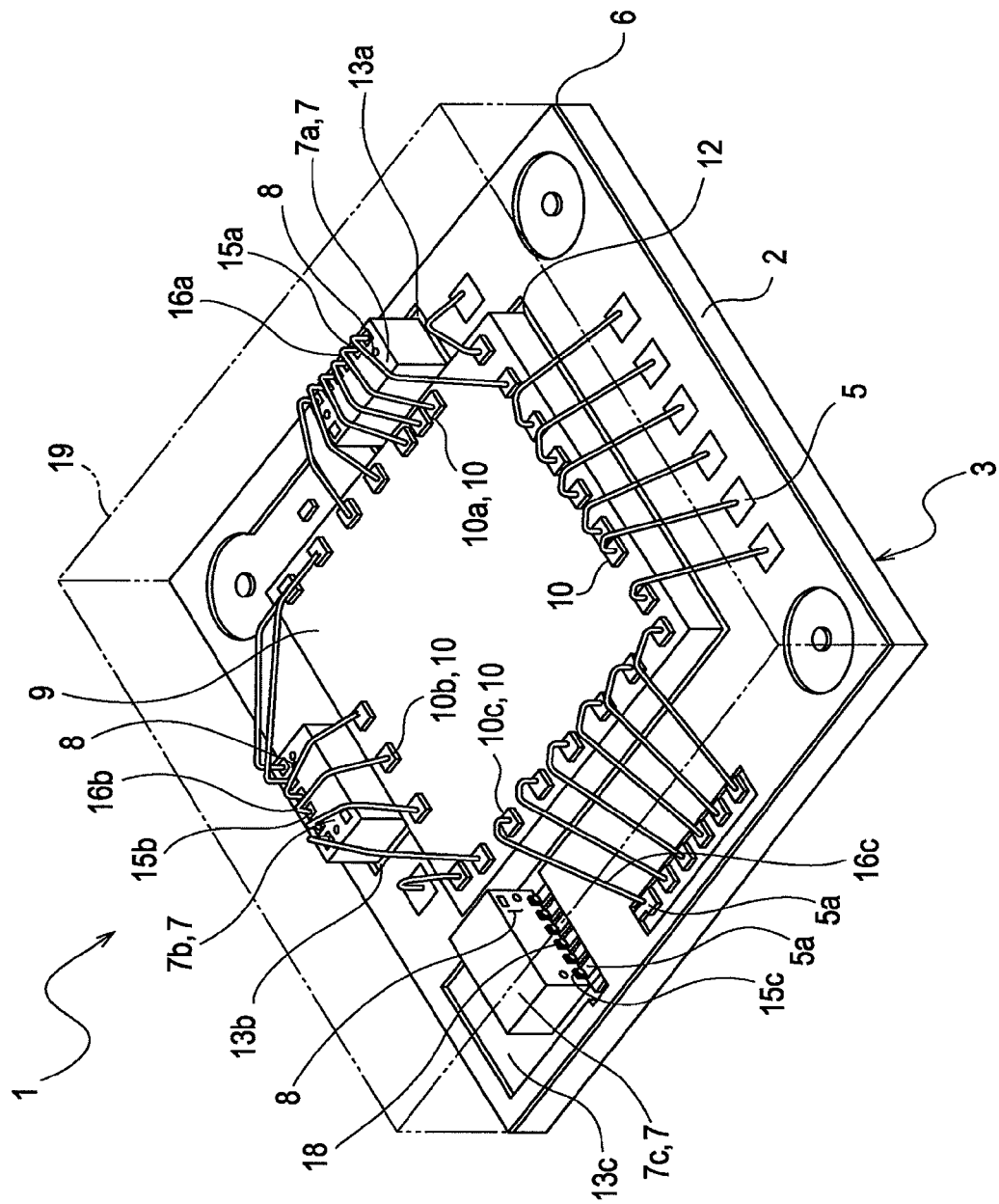
FIG. 1 is a perspective view schematically showing an example of a detection device according to the present invention.
Figure 2:
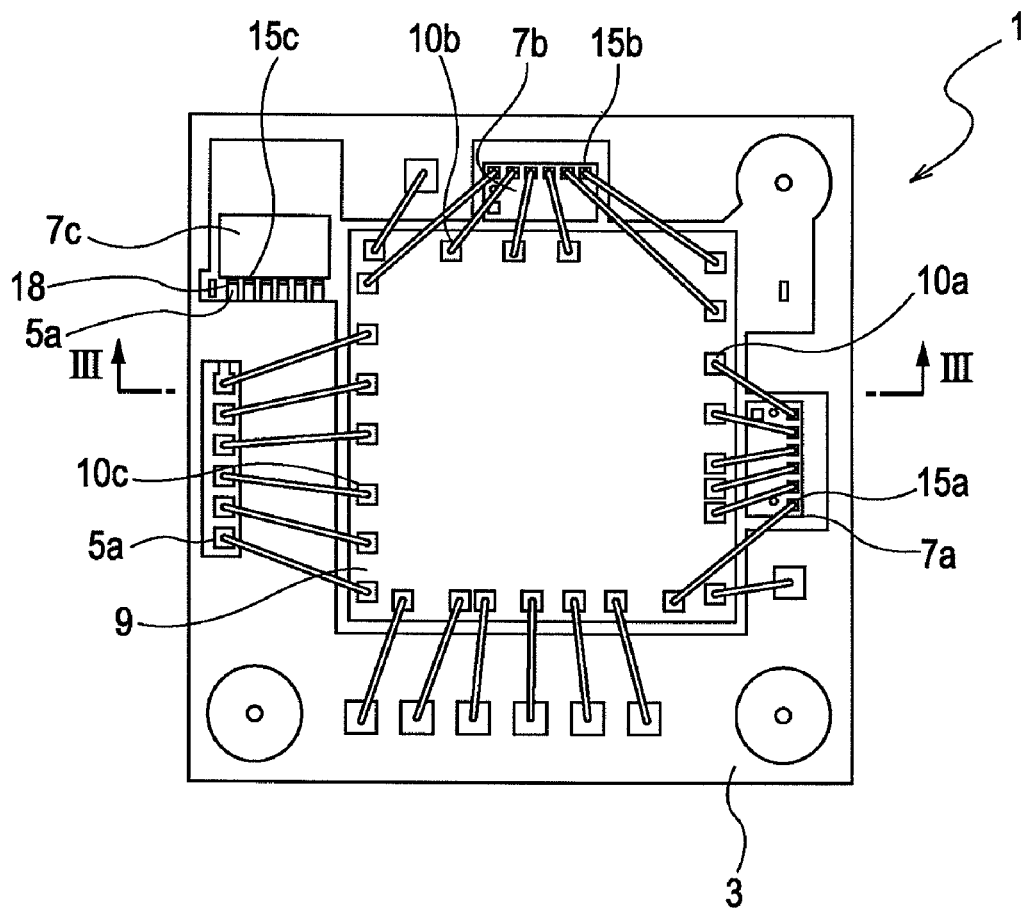
FIG. 2 is a plan view schematically showing the detection device shown in FIG. 1.
Figure 3:
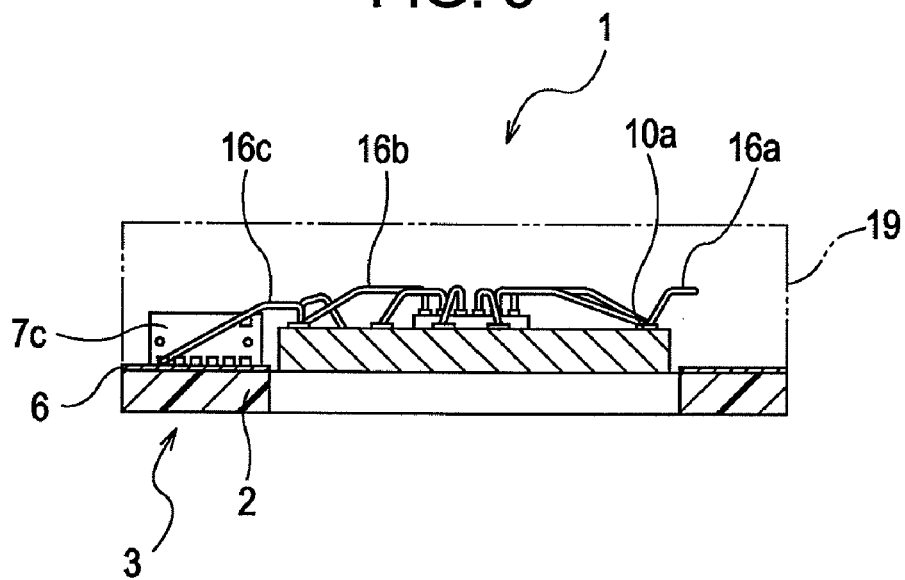
FIG. 3 is a sectional view of the detection device taken along line III-III shown in FIG. 2.

FIG. 1 is a perspective view schematically showing a magnetic direction detector according to the example. FIG. 2 is a plan view schematically showing the magnetic direction detector shown in FIG. 1. FIG. 3 is a sectional view schematically showing the magnetic direction detector taken along line III-III shown in FIG. 2.

Referring to FIGS. 1 to 3, a magnetic direction detector 1 of the example includes a flat plate-like circuit substrate 3 having a square planar shape, which is provided with an insulating substrate 2 formed of various kinds of insulating resin material, for example, ceramics, epoxy resin, polyimide, polyethylene terephthalate, polymethylmethacrylate, and the like. A predetermined pattern wiring 5 is formed on the insulating substrate 2. The circuit substrate 3 is formed by coating the entire surface of the insulating substrate 2 except the end of the wiring 5 with a protective film 6.

Plural rectangular box shaped magnetic sensors 7 (7a, 7b, 7c) each with a sensing axis 8 for detecting the geomagnetism as sensor chips and a single sensor controlling semiconductor 9 for controlling the respective magnetic sensors 7 are directly mounted on the surface of the circuit substrate 3.

Plural electrodes 10 are arranged at predetermined locations on the surface of the sensor controlling semiconductor 9. The sensor controlling semiconductor 9 is directly mounted on the inside of a rectangular recess-like semiconductor mount portion 12 with the planar area slightly larger than that of the sensor controlling semiconductor 9 in the center of the surface of the circuit substrate 3 with the predetermined depth using a not shown bonding material. The semiconductor mount portion 12 forms an opening at a predetermined portion of the protective film 6 to expose the insulating substrate 2. The sensor controlling semiconductor 9 has the electrode-forming surface having the electrode 10 formed thereon directed upward.

The magnetic sensors 7 includes horizontally positioned sensors each having a sensing axis 8 horizontally mounted with respect to a surface of the circuit substrate 3, and cross positioned sensors each having the sensing axis 8 mounted at the angle to cross the surface of the circuit substrate 3. In the example, there are three magnetic sensors 7, that is, an X-axis magnetic sensor 7a for detecting the geomagnetism in the X-axis direction and a Y-axis magnetic sensor 7b for detecting the geomagnetism in a Y-axis direction as the horizontally positioned sensors, and a Z-axis magnetic sensor 7c for detecting the geomagnetism in the Z-axis direction as the cross positioned sensor.

Figure 4A:
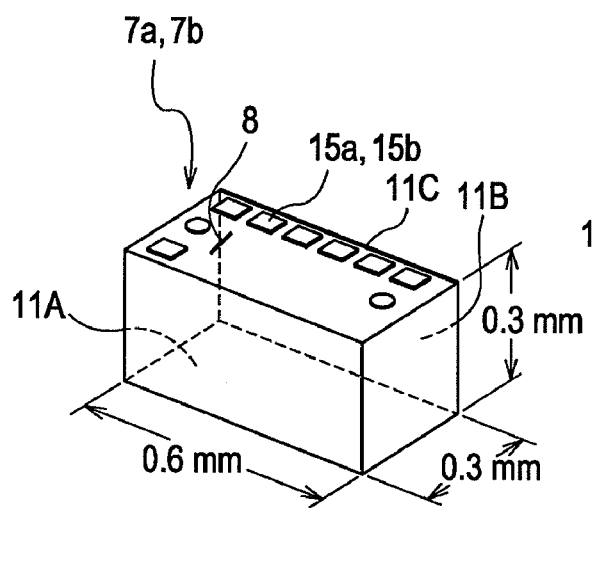
FIGS. 4A and 4B are perspective views each showing a sensor chip used in the detection device shown in FIG. 1.
Figure 4B:
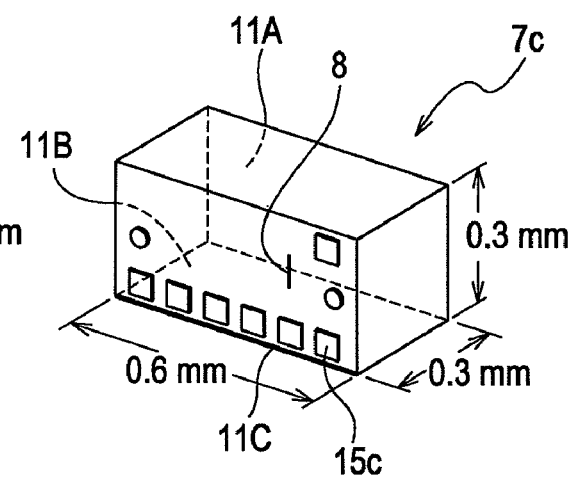

An MR (magnetic resistance effect) element, a GIG (granular in gap) element, an MI (magnetic impedance) element, a flux gate sensor, and a semiconductor hole effect sensor may be used as the magnetic sensor 7. In the example, the MR element is employed. Referring to FIGS. 4A and 4B, each of the magnetic sensors 7 includes a horizontal mount surface 11A which can be directly mounted on the circuit substrate 3 such that one surface is positioned horizontally with respect to the surface of the circuit substrate 3, and a cross mount surface 11B which can be directly mounted on the circuit substrate 3 by mounting the other surface of the magnetic sensor 7 opposite the circuit substrate 3 such that the sensing axis 8 is mounted at an angle crossing the surface of the circuit substrate 3.

Each of the magnetic sensors 7 to be mounted on the single magnetic direction detector 1 is selected from the magnetic sensors 7 fabricated from the same wafer, each having the same structure. The magnetic sensor 7 according to the example has the sensing surface on which the sensing axis 8 for detecting the geomagnetism is formed to have the width of 0.3 mm, the length of 0.6 mm, and the height of 0.3 mm from the upper surface as the sensing surface.

In either case where the magnetic sensors 7 are mounted with the horizontal mount surface 11A or the cross mount surface 11B, plural electrodes 15a, 15b and 15c for conducting the magnetic sensors 7 and the circuit substrate 3 are located at the same positions for the respective magnetic sensors 7 so as to be commonly used. The respective electrodes 15a, 15b and 15c are formed on a side at which one of the horizontal mount surface 11A and the cross mount surface 11B is in contact with the surface opposite the other surface. In the example, the electrodes 15a, 15b and 15c are located in a parallel row at a side of the sensing surface on which the sensing axis 8 is formed for the magnetic sensor 7 on a side 11c where the cross mount surface 11B is in contact with the surface opposite the horizontal mount surface 11A.

The X-axis magnetic sensor 7a among the magnetic sensors 7 is directly mounted to the inside of the recess-like X-axis sensor mount portion 13a with a planar area slightly larger than that of the X-axis magnetic sensor 7a and with the predetermined depth at substantially the center of the right side of the circuit substrate 3 as shown in FIG. 2 around the semiconductor mount portion 12 on the surface of the circuit substrate 3 using the not shown bonding material. The X-axis sensor mount portion 13a is obtained by forming an opening at a predetermined portion of the protective film 6 to expose the insulating substrate 2. The X-axis magnetic sensor 7a is disposed to have the sensing surface directed upward such that the sensing axis 8 is horizontally located on the surface of the circuit substrate 3. The X-axis magnetic sensor 7a is located having one side on which the electrodes 15a on the sensing surface disposed in parallel are positioned at an outer circumferential side of the circuit substrate 3. Then the respective electrodes 15a are disposed in parallel so as to be in parallel with the side surface of the sensor controlling semiconductor 9 opposite the X-axis magnetic sensor 7a. The electrode 15a of the X-axis magnetic sensor 7a is connected to an end of a lead wire 16a formed of a thin gold wire and the like as the conductive connection member. The other end of the lead wire 16a is connected to an X-axis sensor electrode 10a used for conductively connecting the X-axis magnetic sensor 7a among the respective electrodes 10 of the sensor controlling semiconductor 9. The X-axis magnetic sensor 7a is conducted to the circuit substrate 3 on which the sensor controlling semiconductor 9 is mounted.

The Y-axis magnetic sensor 7b is directly mounted to the inside of the recess-like Y-axis sensor mount portion 13b with a planar area slightly larger than that of the Y-axis magnetic sensor 7b and with the predetermined depth at substantially the center of the upper side of the circuit substrate 3 as shown in FIG. 2 around the semiconductor mount portion 12 on the surface of the circuit substrate 3 using the not shown bonding material. The Y-axis sensor mount portion 13b is obtained by forming an opening at a predetermined portion of the protective film 6. The Y-axis magnetic sensor 7b is disposed to have the sensing surface directed upward such that the sensing axis 8 is horizontally located on the surface of the circuit substrate 3. The Y-axis magnetic sensor 7b is located having one side on which the electrodes 15b on the sensing surface disposed in parallel are positioned at an outer circumferential side of the circuit substrate 3. Then the respective electrodes 15b are disposed in parallel so as to be in parallel with the side surface of the sensor controlling semiconductor 9 opposite the Y-axis magnetic sensor 7b. The electrode 15b of the Y-axis magnetic sensor 7b is connected to an end of a lead wire 16b formed of a thin gold wire and the like as the conductive connection member. The other end of the lead wire 16b is connected to an Y-axis sensor electrode lob used for conductively connecting the Y-axis magnetic sensor 7b among the respective electrodes 10 of the sensor controlling semiconductor 9. The Y-axis magnetic sensor 7b is conducted to the circuit substrate 3 on which the sensor controlling semiconductor 9 is mounted.

The Z-axis magnetic sensor 7c is directly mounted to the inside of the recess-like Z-axis sensor mount portion 13c with a planar area slightly larger than that of the Z-axis magnetic sensor 7c and with the predetermined depth at substantially the upper portion of the left side of the circuit substrate 3 as shown in FIG. 2 around the semiconductor mount portion 12 on the surface of the circuit substrate 3 using the not shown bonding material. The Z-axis sensor mount portion 13c is obtained by forming an opening at a predetermined portion of the protective film 6. The Z-axis magnetic sensor 7c has its sensing surface, that is, the electrode-forming surface on which the electrodes 15c are formed is located close to the circuit substrate 3 in the vertical direction such that the side on which the electrodes 15c at the sensing surface are disposed in parallel is located at the side of the circuit substrate 3. As a result, the Z-axis magnetic sensor 7c is located to have the sensing axis 8 positioned in the vertical direction with respect to the surface of the circuit substrate 3. Preferably, the acceptable range with respect to the right angle may be +6° or smaller, and more preferably, +3° or smaller from the aspect of the appropriate detection of the geomagnetism in the Z-axis direction.

Figure 5:
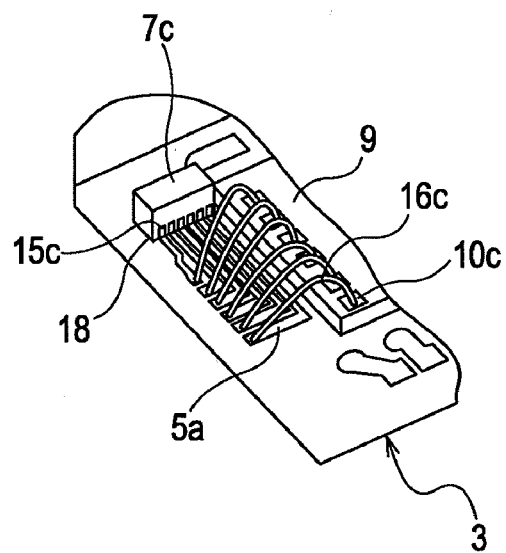
FIG. 5 is a perspective view schematically showing wiring patterns corresponding to the single sensor chip of the detection device shown in FIG. 1.
Figure 6:
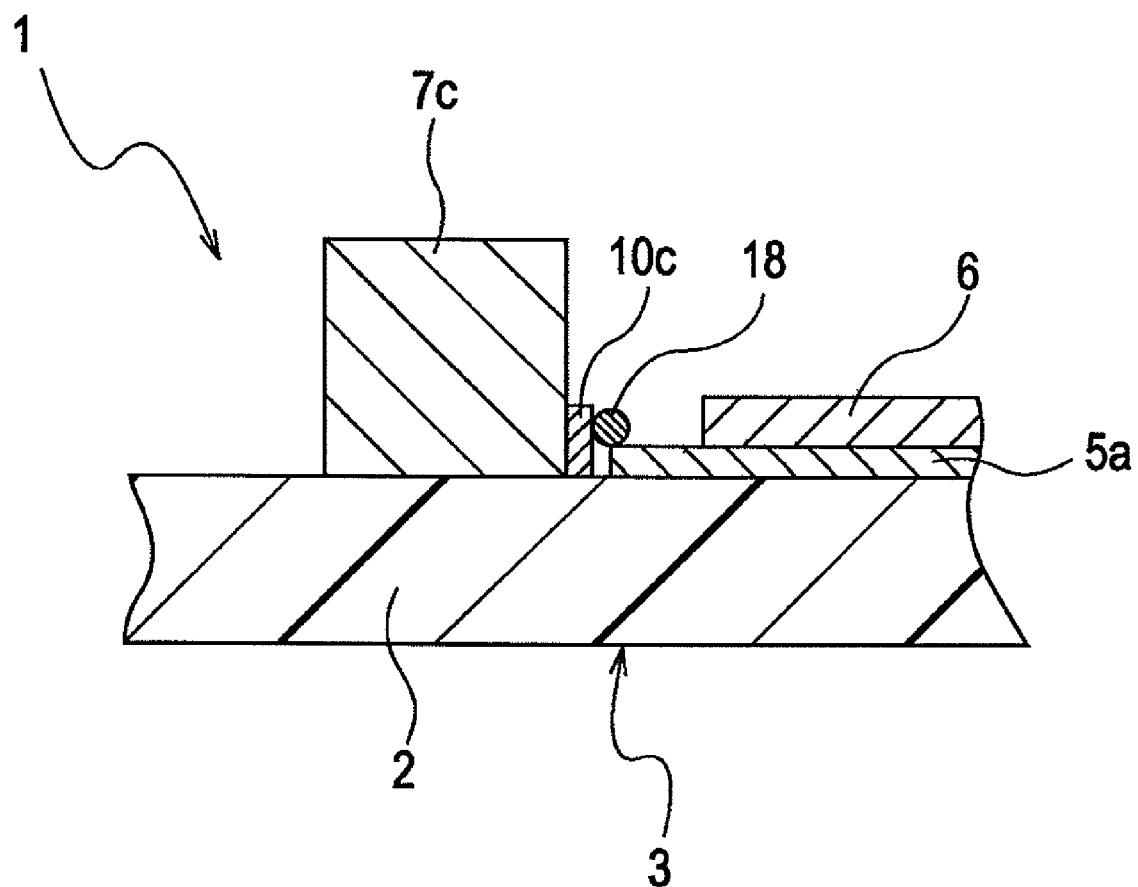
FIG. 6 is a sectional view schematically showing a connection state between the electrode of the Z-axis magnetic sensor and the wiring of the circuit substrate in the detection device shown in FIG. 1.

Z-axis sensor wirings 5a corresponding to the respective electrodes 15c of the Z-axis magnetic sensor 7c are formed therearound on the circuit substrate 3. Referring to FIG. 5, each of the Z-axis sensor wirings 5a is patterned to have one end opposite the corresponding electrode 15d of the Z-axis magnetic sensor 7c, and the other end arranged in parallel with the lay-out direction of the Z-axis sensor electrode 10c used for conductively connecting the Z-axis magnetic sensor 7c among the electrodes 10 of the sensor controlling semiconductor 9. Referring to FIG. 6, one end of the Z-axis sensor wiring 5a is conductively connected to the corresponding electrode 15c of the Z-axis magnetic sensor 7c via a ball-like corner bump 18 formed of such conductive material as gold. The ball-like corner bumps 18 are formed by applying the conductive paste to form each ball-like shape between each of the respective electrodes 15c and one end of the corresponding Z-axis sensor wiring 5a, and heating and applying the ultrasonic wave so as to be bonded to the respective electrodes 15c and the respective Z-axis sensor wirings 5a. The other end of the Z-axis sensor wiring 5a is connected to the corresponding Z-axis sensor electrode 10c via the lead wire 16c formed of the conductive connection member such as the thin gold wire. Accordingly, the Z-axis magnetic sensor 7c is conducted to the circuit substrate 3 on which the sensor controlling semiconductor 9 is mounted.

Each height of the respective magnetic sensors 7 from the circuit substrate 3 is set to be equal to 0.3 mm.

The respective magnetic sensors 7 and the sensor controlling semiconductor 9 are coated with an insulating sealing member 19 on the circuit substrate 3 so as to be integrally sealed. As the sealing member 19, a thermo-setting resin such as an epoxy resin, a phenol resin and an unsaturated polyester, and a thermoplastic resin such as a general-purpose engineering plastic, and super engineering plastic may be employed. Two or more kinds of materials may be mixed (polymer blend) through the chemical process or the mechanical process during the manufacturing step.

The method of manufacturing the magnetic direction detector 1 according to the example will be described.

The magnetic sensors fabricated from the same wafer, each having the same structure at adjacent positions are selected as the X-axis magnetic sensor 7a, the Y-axis magnetic sensor 7b, and the Z-axis magnetic sensor 7c.

The magnetic sensors 7 are directly mounted to the insides of the mount portions 13a, 13b, 13c on the circuit substrate 3 having the predetermined patterns 5(5a) formed thereon by directing the respective sensing axes 8 at predetermined angles. The sensor controlling semiconductor 9 is directly mounted to the inside of the semiconductor mount portion 12 on the circuit substrate 3 using the bonding material by directing the surface on which the electrodes are formed upward. Thereafter, the conductive paste is applied to have a ball-like shape at a corner between the respective electrodes 15c of the Z-axis magnetic sensor 7c and one end of the Z-axis sensor wiring 5a so as to form the corner bump 18. It is then heated and subjected to the ultrasonic wave to be bonded to the electrodes 15c of the Z-axis magnetic sensor 7c and the Z-axis sensor wirings 5a so as to perform the conductive connection therebetween. The lead wires 16a and 16b are connected to the electrodes 15a, 15b for the X-axis magnetic sensor 7a and the Y-axis magnetic sensor 7b, and the X-axis sensor electrodes 10a and the Y-axis sensor electrodes 10b of the sensor controlling semiconductor 9 through the wire bonding process so as to perform the conductive connection between the electrodes 15a, 15b of the X-axis and Y-axis magnetic sensors 7a, 7b and the X-axis and Y-axis sensor electrodes 10a, 10b. The lead wires 16c are connected to the other end portions of the Z-axis sensor wiring 5a and the Z-axis sensor electrode 10c of the sensor controlling semiconductor 9 through the wire bonding process so as to perform the conductive connection between the respective electrodes 15c of the Z-axis magnetic sensor 7c and the Z-axis electrodes 10c via the Z-axis sensor wirings 5a and the lead wires 16c by conductively connecting the Z-axis sensor wirings 5a and the Z-axis sensor electrodes 10c. The sealing member 19 is applied on the entire surface of the circuit substrate 3 to coat the respective magnetic sensors 7 and the sensor controlling semiconductor 9 to manufacture the magnetic direction detector 1.

Operations of the magnetic direction detector 1 according to the example will be described hereinafter.

In the magnetic direction detector 1 according to the example, the magnetic sensors 7 are selected from those fabricated from the same wafer, each having the same structure, thus making each magnetic property of the magnetic sensors 7 uniform. The magnetic sensor 7 may be directly mounted on the circuit substrate 3 by positioning the sensing axis 8 horizontally with respect to the surface of the circuit substrate 3 as well as vertically thereto. The magnetic sensors 7 fabricated from the same wafer may be used for forming the magnetic direction detector 1 which detects three-axis geomagnetism in directions of X-axis, Y-axis, and Z-axis. The magnetic sensors 7 may be directly mounted on the circuit substrate 3 without using the sub-circuit substrate.

The magnetic direction detector 1 according to the example employs the magnetic sensors 7 each having the uniform magnetic property to detect the geomagnetism, thus accurately detecting the azimuth while preventing the error in detection of the geomagnetism. The magnetic direction detector 1 according to the example ensures to easily improve the reliability, thus facilitating the high performance. As the magnetic sensors 7 may be directly mounted on the circuit substrate 3 without using the sub-circuit substrate, the number of parts to be used may be reduced. The manufacturing step for mounting the sub-circuit substrate on which the magnetic sensors 7 are mounted on the main circuit substrate 3 may be eliminated, resulting in the reduced cost. The magnetic sensors 7 are directly mounted on the circuit substrate 3 to reduce the size of the magnetic direction detector 1 while preventing displacement of the sensing axis 8. This makes it possible to manufacture the magnetic direction detector 1 with high reliability.

The electrodes 15a, 15b, 15c of the respective magnetic sensors 7 are arranged in a parallel row at each one side of the sensing surface to simplify the leading operation of the lead wires 16a, 16b, 16c for the conductive connection between the electrodes 15a, 15b, 15c, and the X-axis, Y-axis, and Z-axis sensor electrodes 10a, 10b, 10c of the sensor controlling semiconductor 9. The workability of the leading operation of the lead wires 16a, 16b, 16c may be improved, and the short-circuit caused by the abutment among those lead wires 16a, 16b, 16c may be prevented. The lead wires 16a, 16b, 16c may be led without being entangled with one another, thus reducing the size of the magnetic direction detector 1. The X-axis magnetic sensor 7a and the Y-axis magnetic sensor 7b are located such that one side of the sensing surface on which the electrodes 15a, 15b are placed in parallel is positioned at the outer circumference of the circuit substrate 3. This makes it possible to connect the X-axis magnetic sensor 7a and the Y-axis magnetic sensor 7b to the sensor controlling semiconductor 9 while maintaining each length of the lead wires 16a, 16b at a predetermined value. As a result, the distance between the X-axis and Y-axis magnetic sensors 7a, 7b, and the sensor controlling semiconductor 9 may be shortened, thus reducing the size of the magnetic direction detector 1.

The Z-axis sensor wiring 5a is formed on the circuit substrate 3 for connecting the electrodes 15c of the Z-axis magnetic sensor 7c and the Z-axis sensor electrodes 10c of the sensor controlling semiconductor 9. The Z-axis sensor wiring 5a is patterned to have one end portion directed opposite the electrode 15c of the Z-axis magnetic sensor 7c, and the other end portion located in parallel with the lay-out direction of the Z-axis sensor electrode 10c of the sensor controlling semiconductor 9. Accordingly, the leading operation of the lead wire 16c for the conductive connection between the respective electrode 15c of the Z-axis magnetic sensor 7c and the Z-axis sensor electrode 10c of the sensor controlling semiconductor 9 may be simplified, thus improving the workability for leading the lead wire 16c. The short-circuit caused by the abutment among the lead wires 16c may be prevented, and the leading operation may be performed while preventing entanglement of the lead wires 16c, thus making it possible to provide the magnetic direction detector 1 with a thin structure.

The electrodes 15c of the Z-axis magnetic sensor 7c are conductively connected to the respective wirings 5 with the ball-like corner bumps 18 so as to cope with the respective electrodes 15c at narrow pitches.

The electrodes 15a, 15b, 15c for the magnetic sensors 7 may be conducted to the circuit substrate 3 with the common electrode in either case where the magnetic sensors 7 are mounted on the horizontal mount surface or the cross mount surface. The different electrodes do not have to be used for mounting the sensors on the horizontal mount surface and the cross mount surface, thus reducing the cost for manufacturing the sensor chips, and simplifying the manufacturing process.

The present invention is not limited to the aforementioned examples, but may be modified into various forms as needed.

In the example, three magnetic sensors 7, that is, the X-axis magnetic sensor 7a, the Y-axis magnetic sensor 7b, and the Z-axis magnetic sensor 7c are employed. However, the number of the magnetic sensors is not limited. The number of the magnetic sensors 7 may be set to 4 or more for detecting directions at more axes so as to detect the gradient of the magnetic direction detector 1, for example.

The respective sensing surfaces of the X-axis and Y-axis magnetic sensors 7a and 7b may be vertically located close to the circuit substrate 3, and the sensing surface of the Z-axis magnetic sensor 7c may be located opposite the abutment surface.

What is claimed is:

1. A detection device with a plurality of sensor chips each having at least one sensing axis directly mounted on a circuit substrate, wherein:

the plurality of sensor chips each have a sensing surface that has a sensor element therein;

the plurality of sensor chips include a horizontally positioned sensor having the sensing axis horizontally located with respect to one surface of the circuit substrate, the horizontally positioned sensor having a horizontal mount surface that is parallel to the sensing surface of the horizontally positioned sensor, and a cross positioned sensor having the sensing axis located at an angle crossing the circuit substrate, the cross positioned sensor having a cross mount surface that is crossing to the sensing surface of the cross position sensor, the horizontal mount surface and the cross mount surface facing the circuit substrate; and the horizontally positioned sensor has the same structure as that of the cross positioned sensor.

2. The detection device according to claim 1, wherein the horizontally positioned sensor and the cross positioned sensor are conducted to the circuit substrate using the same electrodes of the respective sensors at the same locations.

3. The detection device according to claim 2, wherein the same electrodes are formed on the sensor chip in a row.

4. The detection device according to claim 3, wherein:

at least one of the sensor chips is mounted such that one side where the electrodes provided in a row on an electrode-forming surface on which the electrodes are formed is positioned at a side of the circuit substrate; and a wiring is formed on the circuit substrate for connecting the electrodes of the sensor chip and the circuit substrate.

5. The detection device according to claim 4, wherein a ball-shaped corner bump is used for conductively connecting the electrodes of the sensor chip and the wiring.

6. The detection device according to claim 1, wherein the sensor chip includes at least an X-axis magnetic sensor which allows the sensing axis to detect a geomagnetic azimuth in an X-axis direction, a Y-axis magnetic sensor which allows the sensing axis to detect a geomagnetism in a Y-axis direction, and a Z-axis magnetic sensor which allows the sensing axis to detect a geomagnetism in a Z-axis direction.

7. A method of manufacturing a detection device which mounts a plurality of sensor chips each with at least one sensing axis on a circuit substrate and each have a sensing surface that has a sensor element therein, comprising the steps of:

selecting the sensor chips from sensor chips which are fabricated from a same wafer to have same structures; and mounting the sensor chips having the sensing axes directed at different predetermined angles, including mounting a horizontally positioned sensor having the sensing axis horizontally located with respect to one surface of the circuit substrate, the horizontally positioned sensor having a horizontal mount surface that is parallel to the sensing surface of the horizontally positioned sensor, and mounting a cross positioned sensor having the sensing axis located at an angle crossing the circuit substrate, the cross positioned sensor having a cross mount surface that is crossing to the sensing surface of the cross position sensor, the horizontal mount surface and the cross mount surface facing the circuit substrate.

8. The method of manufacturing a detection device according to claim 7, wherein each of the respective sensing axes includes at least an axis which is horizontal with respect to the circuit substrate, and an axis which crosses the circuit substrate.

9. The method of manufacturing a detection device according to claim 7, further comprising an inspection step for inspecting each property of the sensor chips to select and mount the sensor chips from those fabricated from the same wafer, each having the same property.

10. The detection device according to claim 1, wherein the detection device is an accelerator sensor for detecting acceleration.

11. The detection device according to claim 1, wherein the detection device is an angular speed sensor.

* * * * *

UNITED STATES PATENT AND TRADEMARK OFFICE
CERTIFICATE OF CORRECTION

| | | |
|---|---|---|
| PATENT NO. | : 7,992,313 B2 | Page 1 of 1 |
| APPLICATION NO. | : 12/539225 | |
| DATED | : August 9, 2011 | |
| INVENTOR(S) | : Naoki Kitaura et al. | |

It is certified that error appears in the above-identified patent and that said Letters Patent is hereby corrected as shown below:

In the Claims

In column 11, claim 1, line 2, after "horizontally positioned sensor" replace "haying" with --having--.

Signed and Sealed this
Eighteenth Day of October, 2011

David J. Kappos
*Director of the United States Patent and Trademark Office*